United States Patent
Brobston

(10) Patent No.: US 7,773,693 B2
(45) Date of Patent: Aug. 10, 2010

(54) APPARATUS AND METHOD FOR DIRECT QUADRATURE POWER AMPLIFIER MODULATION

(75) Inventor: Michael L. Brobston, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 1176 days.

(21) Appl. No.: 11/168,227

(22) Filed: Jun. 28, 2005

(65) Prior Publication Data
US 2006/0078067 A1   Apr. 13, 2006

Related U.S. Application Data

(60) Provisional application No. 60/616,912, filed on Oct. 7, 2004.

(51) Int. Cl.
    H04L 27/36 (2006.01)
(52) U.S. Cl. ...................................... 375/298
(58) Field of Classification Search ............ 375/297, 375/298, 308
    See application file for complete search history.

(56) References Cited

U.S. PATENT DOCUMENTS

| | | | | |
|---|---|---|---|---|
| 3,798,371 A | * | 3/1974 | Melvin | 375/308 |
| 4,614,901 A | * | 9/1986 | Kullman et al. | 318/99 |
| 6,160,838 A | * | 12/2000 | Shinohara et al. | 375/130 |
| 6,175,272 B1 | * | 1/2001 | Takita | 330/10 |
| 6,307,894 B2 | * | 10/2001 | Eidson et al. | 375/297 |
| 6,566,941 B2 | * | 5/2003 | Guo | 329/304 |
| 2001/0009574 A1 | * | 7/2001 | Iemura | 375/322 |
| 2002/0118728 A1 | * | 8/2002 | Mohseni et al. | 375/146 |
| 2002/0142717 A1 | | 10/2002 | Morimoto | |
| 2003/0161278 A1 | * | 8/2003 | Igura | 370/320 |
| 2004/0037370 A1 | * | 2/2004 | Mori et al. | 375/322 |
| 2004/0047432 A1 | * | 3/2004 | Iwasaki | 375/297 |
| 2004/0062322 A1 | * | 4/2004 | Sachse et al. | 375/308 |

FOREIGN PATENT DOCUMENTS

CN     1201351 A     12/1998

OTHER PUBLICATIONS

Grundlingh et al ("A high efficiency Chireix out-phasing power amplifier for 5GHz WLAN applications", Microwave Symposium Digest, 2004 IEEE MTT-S International, Publication Date: Jun. 6-11, 2004, vol. 3, pp. 1535-1538).*

* cited by examiner

Primary Examiner—David C Payne
Assistant Examiner—Leon-Viet Q Nguyen

(57) ABSTRACT

A direct power amplifier modulator that accepts bipolar I and Q data, either baseband or multi-carrier digital IF, and generates the resultant magnitude and sign components. Also described is a direct power amplifier modulator that generates quadrature terms of the carrier frequency offset by 90°, wherein each term is shifted by 180° under control of the respective sign components of the quadrature I and Q samples. The present invention also provides a transistor structure configured to accept differential quadrature frequency components that are combined in a post PA outphasing combiner.

20 Claims, 5 Drawing Sheets

APPARATUS AND METHOD FOR DIRECT QUADRATURE POWER AMPLIFIER MODULATION

CROSS-REFERENCE TO RELATED APPLICATION AND CLAIM OF PRIORITY

The present invention is related to that disclosed in U.S. Provisional Patent No. 60/616,912, filed Oct. 7, 2004, entitled "Apparatus And Method For Direct Quadrature Power Amplifier Modulation". U.S. Provisional Patent No. 60/616,912 is assigned to the assignee of the present application. The subject matter disclosed in U.S. Provisional Patent No. 60/616,912 is hereby incorporated by reference into the present disclosure as if fully set forth herein. The present application hereby claims priority under 35 U.S.C. §119(e) to U.S. Provisional Patent No. 60/616,912.

TECHNICAL FIELD OF THE INVENTION

The present invention relates generally to RF transmitters and, in particular, to a switch mode RF power amplifier.

BACKGROUND OF THE INVENTION

In conventional radio frequency (RF) transmitters, RF power amplifiers are operated linearly in class A, class AB, or class C bias conditions. The problem with these bias classes is that the efficiency of the power stage is limited due to high dissipation in the power stage resulting from either quiescent bias or basic ohmic losses. A large body of research has been devoted to the development of new RF transmitters capable of generating linear RF power using non-linear power amplifiers operating in switch mode in order to increase the power-added efficiency.

Various switch mode techniques have been proposed to improve the power-added efficiency of the power amplifier (PA) stage. These techniques include: i) polar modulation; ii) envelope elimination and restoration; iii) LINC; and iv) delta sigma modulation. In each case, some form of direct modulation is applied in the power amplifier stage. The general concept is to operate the final amplifier stage in switch mode, wherein the final power transistor stage is driven between pinch-off and saturation at the carrier frequency rate or some multiple thereof. By minimizing the percentage of a cycle in which the transistor is in the linear operating region, the power dissipated in the transistor is minimized and a high level of power added efficiency is obtained.

The obvious drawback of this approach is that, to maintain high modulation accuracy and to avoid generating adjacent channel interference, a high degree of envelope linearity is required in the amplifier stage. As a result, high efficiency power amplification techniques focus on maintaining the envelope integrity of the amplified waveform, although the carrier itself will be clipped by switch mode operation. The result is that the in-band modulation accuracy and adjacent channel integrity are preserved, even though a high level of harmonics are generated. The harmonic content is easily filtered after the amplifier stage.

In the polar modulation (or EER) method, the quadrature baseband information is converted to polar components of amplitude and phase. An oscillator operating at the carrier frequency drives the gate of a switch-mode power amplifier (PA) with a constant amplitude, constant frequency signal. The phase component of the complex waveform is used to phase modulate the oscillator controlling the phase of the PA output. The amplitude component is used to amplitude modulate the switch-mode PA by controlling the PA drain bias. Pre-distortion is commonly used to maintain a linear envelope. A high level of carrier harmonics are generated by the switching waveform, so a greater amount of harmonic filtering must be used than is typically required after a linear PA.

One weakness of the polar modulation approach is that the delays through the amplitude modulation path and the phase modulation path are inherently different due to fundamentally different circuit topologies and are subject to differing amounts of variation due to temperature or component variations. A small timing error (>2 nanoseconds) may result in intolerable modulation errors for wideband modulation formats.

In the LINC method, two common frequency components generated from switch mode power amplifier stages are phase modulated then combined so they add and subtract linearly to produce a quadrature modulated carrier. This requires some unique power combining techniques that enable combination of non-coherent waveforms into a load without excessive power dissipation in the combiner. Achieving high efficiency combining has been a significant challenge to implementation of this technique.

The delta-sigma modulation method typically uses a high-order (fourth) delta sigma bandpass loop as a single bit analog to digital converter. This produces a noise transfer function having a notch at the Fs/2 or Fs/4 frequency. A good signal-to-noise ratio may therefore be achieved when a carrier is operated within the notch of the noise transfer function. The single bit output of this loop is used to drive the gate of a switch mode PA. A narrow bandpass filter is used after the power amplifier (PA) to eliminate the broadband noise outside the carrier bandwidth.

One of the challenges of implementing this approach is that the delta-sigma loop must be clocked at twice to four times the carrier frequency. For carriers in the US PCS or IMT-2000 bands, this can be a significant challenge, given current device speeds. Another limitation is that the instantaneous bandwidth of the modulator is limited to about 20 MHz, depending on the order and clock rate of the delta-sigma loop. In addition, the fixed bandpass filter following the PA stage greatly limits the operating band of the PA.

Therefore, there is a need in the art for an improved power amplifier that performs switch mode power amplification without encountering the problems described above.

SUMMARY OF THE INVENTION

The present invention provides a form of switch mode power amplification that avoids the problems encountered with the prior methods. The present invention provides a direct power amplifier modulator that accepts bipolar I and Q data, either baseband or multi-carrier digital IF, and generates the resultant magnitude and sign components. The present invention also provides a direct power amplifier modulator that generates quadrature terms of the carrier frequency offset by 90°, wherein each term is shifted by 180° under control of the respective sign components of the quadrature I and Q samples. The present invention also provides a transistor structure configured to accept differential quadrature frequency components that are combined in a post PA outphasing combiner.

According to one embodiment of the present invention, there is provided an RF transmitter comprising a quadrature source data block capable of receiving an input in-phase (I) data stream and an input quadrature (Q) data stream and generating therefrom an in-phase absolute value (|I|') data signal and a quadrature absolute value (|Q|') data signal; and a quadrature modulation block comprising a first totem pole transistor structure containing a first bias modulator controlled by said |I|' data signal and a second totem pole transistor structure containing a second bias modulator controlled by said |Q|' data signal.

According to other embodiments of the present invention, there are provided base and mobile stations for use in a wireless network, each for use in a wireless network, each comprising a processor and an accessible memory; a transceiver connected to be controlled by the processor, the transceiver including a quadrature source data block capable of receiving an input in-phase (I) data stream and an input quadrature (Q) data stream and generating therefrom an in-phase absolute value (|I|') data signal and a quadrature absolute value (|Q|') data signal, and a quadrature modulation block comprising a first totem pole transistor structure containing a first bias modulator controlled by said |I|' data signal and a second totem pole transistor structure containing a second bias modulator controlled by said |Q|' data signal.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged RF transmitter.

The invention disclosed by this form attempts to gain the efficiency advantages of the other switch modes of power amplifier operation while avoiding the issues associated with the these alternate approaches. The technique described herein involves a direct quadrature modulation of the switch-mode power amplifier.

Figure 1:
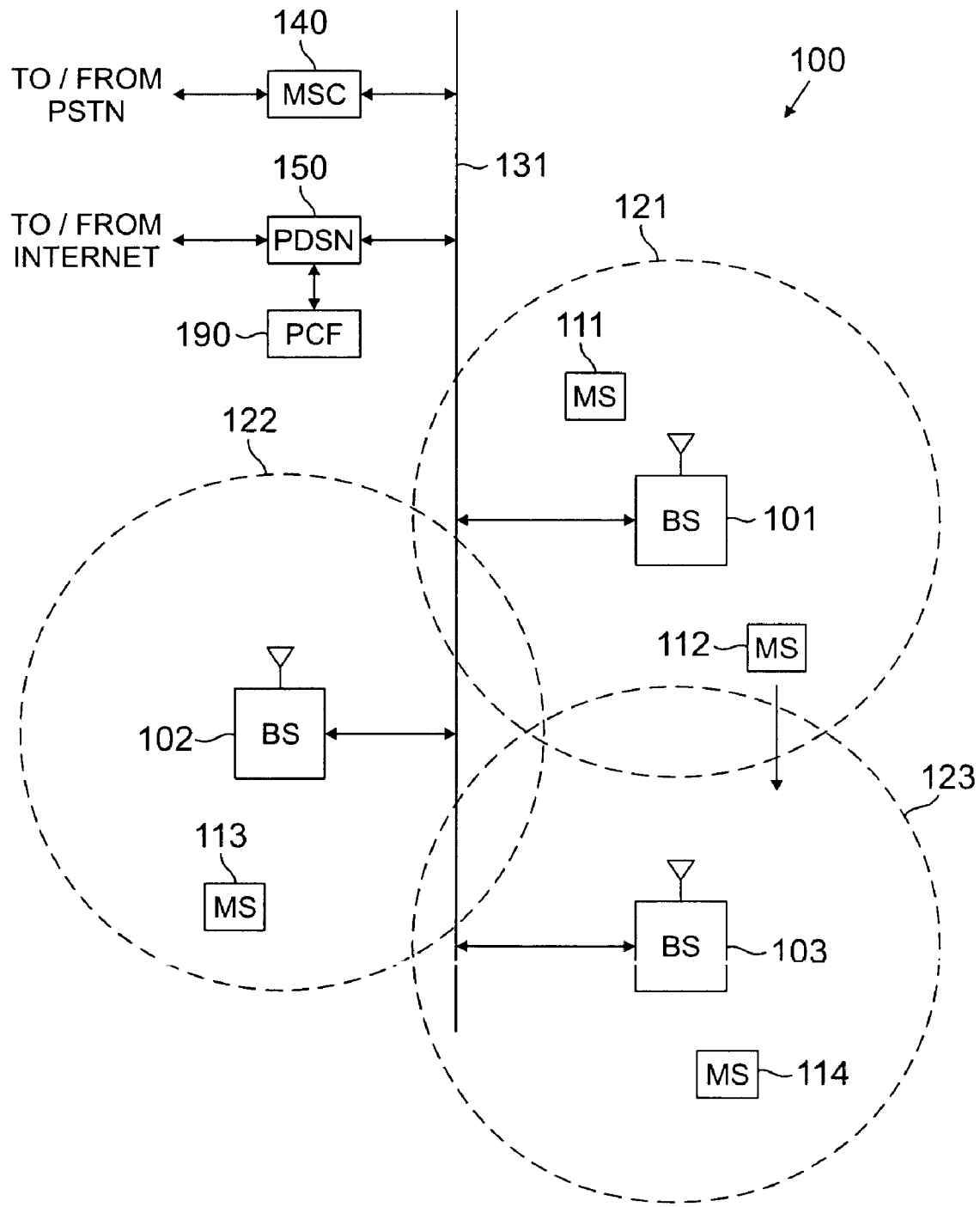
FIG. 1 illustrates exemplary wireless network according to the principles of the present invention.

FIG. 1 illustrates exemplary wireless network according to the principles of the present invention.

Wireless network 100 comprises a plurality of cell sites 121-123, each containing one of the base stations, BS 101, BS 102, or BS 103. Base stations 101-103 communicate with a plurality of mobile stations (MS) 111-114 over code division multiple access (CDMA) channels according to, for example, the IS-2000 standard (i.e., CDMA2000). In an advantageous embodiment of the present invention, mobile stations 111-114 are capable of receiving data traffic and/or voice traffic on two or more CDMA channels simultaneously. Mobile stations 111-114 may be any suitable wireless devices (e.g., conventional cell phones, PCS handsets, personal digital assistant (PDA) handsets, portable computers, telemetry devices) that are capable of communicating with base stations 101-103 via wireless links.

The present invention is not limited to mobile devices. The present invention also encompasses other types of wireless access terminals, including fixed wireless terminals. For the sake of simplicity, only mobile stations are shown and discussed hereafter. However, it should be understood that the use of the term "mobile station" in the claims and in the description below is intended to encompass both truly mobile devices (e.g., cell phones, wireless laptops) and stationary wireless terminals (e.g., a machine monitor with wireless capability).

Dotted lines show the approximate boundaries of cell sites 121-123 in which base stations 101-103 are located. The cell sites are shown approximately circular for the purposes of illustration and explanation only. It should be clearly understood that the cell sites may have other irregular shapes, depending on the cell configuration selected and natural and man-made obstructions.

As is well known in the art, each of cell sites 121-123 is comprised of a plurality of sectors, where a directional antenna coupled to the base station illuminates each sector. The embodiment of FIG. 1 illustrates the base station in the center of the cell. Alternate embodiments may position the directional antennas in corners of the sectors. The system of the present invention is not limited to any particular cell site configuration.

In one embodiment of the present invention, each of BS 101, BS 102 and BS 103 comprises a base station controller (BSC) and one or more base transceiver subsystem(s) (BTS). Base station controllers and base transceiver subsystems are well known to those skilled in the art. A base station controller is a device that manages wireless communications resources, including the base transceiver subsystems, for specified cells within a wireless communications network. A base transceiver subsystem comprises the RF transceivers, antennas, and other electrical equipment located in each cell site. This equipment may include air conditioning units, heating units, electrical supplies, telephone line interfaces and RF transmitters and RF receivers. For the purpose of simplicity and clarity in explaining the operation of the present invention, the base transceiver subsystems in each of cells 121, 122 and 123 and the base station controller associated with each base transceiver subsystem are collectively represented by BS 101, BS 102 and BS 103, respectively.

BS 101, BS 102 and BS 103 transfer voice and data signals between each other and the public switched telephone network (PSTN) (not shown) via communication line 131 and mobile switching center (MSC) 140. BS 101, BS 102 and BS 103 also transfer data signals, such as packet data, with the Internet (not shown) via communication line 131 and packet data server node (PDSN) 150. Packet control function (PCF) unit 190 controls the flow of data packets between base stations 101-103 and PDSN 150. PCF unit 190 may be implemented as part of PDSN 150, as part of MSC 140, or as a stand-alone device that communicates with PDSN 150, as shown in FIG. 1. Line 131 also provides the connection path for control signals transmitted between MSC 140 and BS 101, BS 102 and BS 103 that establish connections for voice and data circuits between MSC 140 and BS 101, BS 102 and BS 103.

Communication line 131 may be any suitable connection means, including a T1 line, a T3 line, a fiber optic link, a network packet data backbone connection, or any other type of data connection. Line 131 links each vocoder in the BSC with switch elements in MSC 140. The connections on line 131 may transmit analog voice signals or digital voice signals in pulse code modulated (PCM) format, Internet Protocol (IP) format, asynchronous transfer mode (ATM) format, or the like.

MSC 140 is a switching device that provides services and coordination between the subscribers in a wireless network and external networks, such as the PSTN or Internet. MSC 140 is well known to those skilled in the art. In some embodiments of the present invention, communications line 131 may be several different data links where each data link couples one of BS 101, BS 102, or BS 103 to MSC 140.

In the exemplary wireless network 100, MS 111 is located in cell site 121 and is in communication with BS 101. MS 113 is located in cell site 122 and is in communication with BS 102. MS 114 is located in cell site 123 and is in communication with BS 103. MS 112 is also located close to the edge of cell site 123 and is moving in the direction of cell site 123, as indicated by the direction arrow proximate MS 112. At some point, as MS 112 moves into cell site 123 and out of cell site 121, a hand-off will occur.

Figure 2:
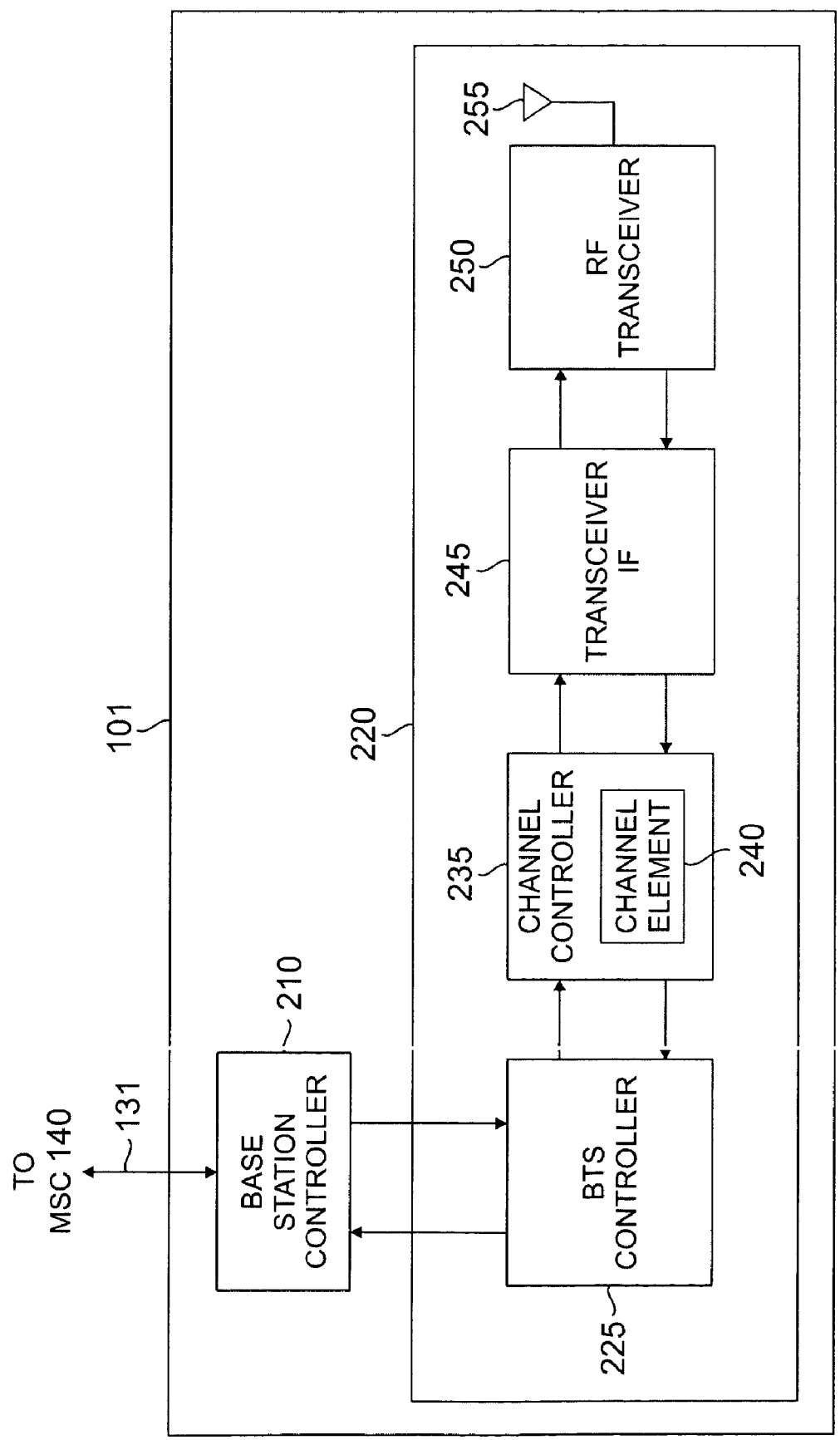
FIG. 2 illustrates exemplary base station according to an exemplary embodiment of the present invention.

FIG. 2 illustrates exemplary base station 101 in greater detail according to an exemplary embodiment of the present invention. Base station 101 comprises base station controller (BSC) 210 and base transceiver station (BTS) 220. Base station controllers and base transceiver stations were described previously in connection with FIG. 1. BSC 210 manages the resources in cell site 121, including BTS 220. BTS 120 comprises BTS controller 225, channel controller 235 (which contains representative channel element 240), transceiver interface (IF) 245, RF transceiver 250, and antenna array 255.

BTS controller 225 comprises processing circuitry and memory capable of executing an operating program that controls the overall operation of BTS 220 and communicates with BSC 210. Under normal conditions, BTS controller 225 directs the operation of channel controller 235, which contains a number of channel elements, including channel element 240, that perform bi-directional communications in the forward channel and the reverse channel. A "forward" channel refers to outbound signals from the base station to the mobile station and a "reverse" channel refers to inbound signals from the mobile station to the base station. Transceiver IF 245 transfers the bi-directional channel signals between channel controller 240 and RF transceiver 250.

Antenna array 255 transmits forward channel signals received from RF transceiver 250 to mobile stations in the coverage area of BS 101. Antenna array 255 also sends to RF transceiver 250 reverse channel signals received from mobile stations in the coverage area of BS 101. In a preferred embodiment of the present invention, antenna array 255 is multi-sector antenna, such as a three-sector antenna in which each antenna sector is responsible for transmitting and receiving in a 120° arc of coverage area. Additionally, RF transceiver 250 may contain an antenna selection unit to select among different antennas in antenna array 255 during both transmit and receive operations.

Figure 3:
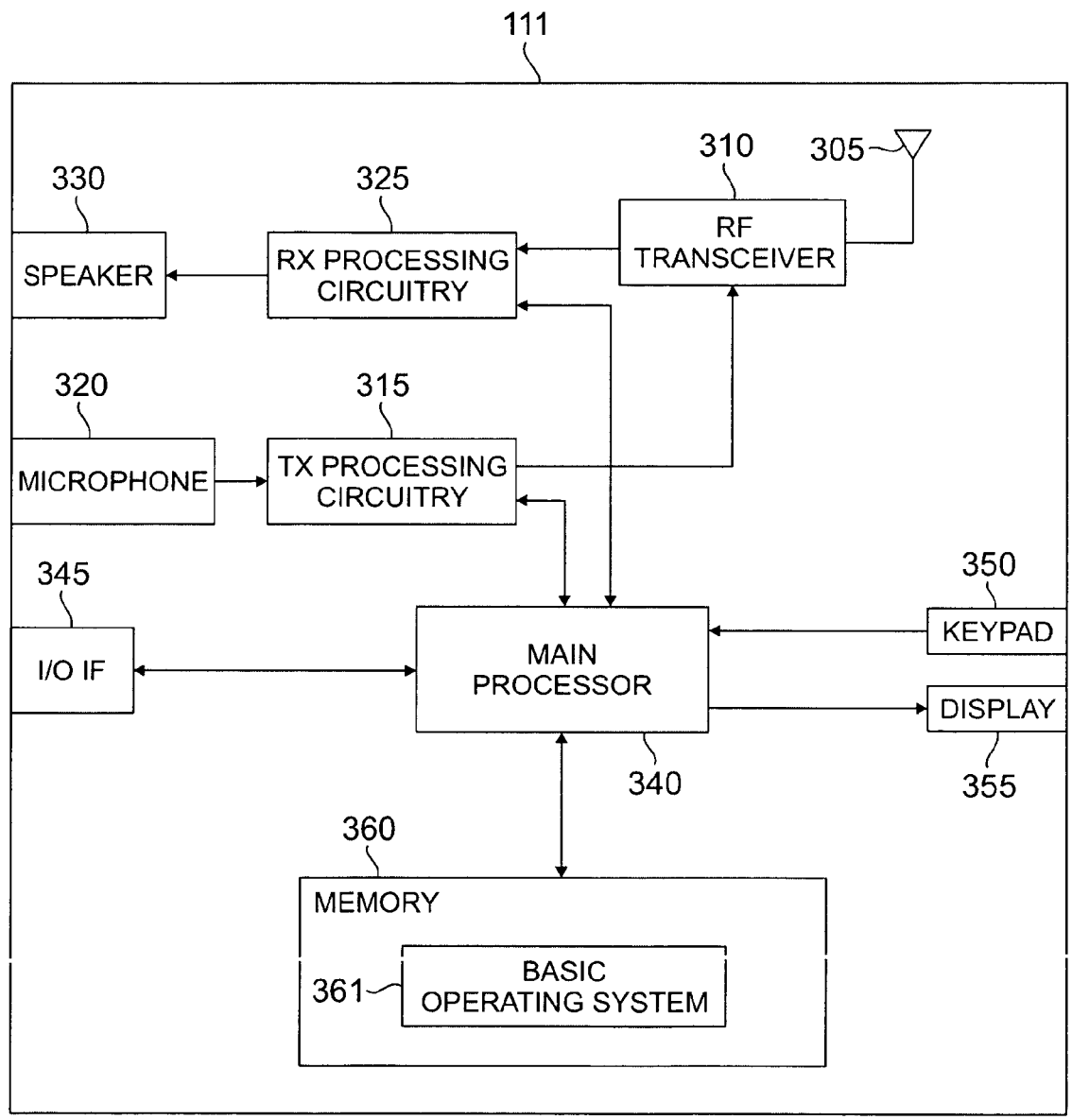
FIG. 3 illustrates wireless mobile station according to an advantageous embodiment of the present invention.

FIG. 3 illustrates wireless mobile station 111 according to an advantageous embodiment of the present invention. Wireless mobile station 111 comprises antenna 305, radio frequency (RF) transceiver 310, transmit (TX) processing circuitry 315, microphone 320, and receive (RX) processing circuitry 325. MS 111 also comprises speaker 330, main processor 340, input/output (I/O) interface (IF) 345, keypad 350, display 355, and memory 360. Memory 360 further comprises basic operating system (OS) program 361.

Radio frequency (RF) transceiver 310 receives from antenna 305 an incoming RF signal transmitted by a base station of wireless network 100. Radio frequency (RF) transceiver 310 down-converts the incoming RF signal to produce an intermediate frequency (IF) or a baseband signal. The IF or baseband signal is sent to receiver (RX) processing circuitry 325 that produces a processed baseband signal by filtering, decoding, and/or digitizing the baseband or IF signal. Receiver (RX) processing circuitry 325 transmits the processed baseband signal to speaker 330 (i.e., voice data) or to main processor 340 for further processing (e.g., web browsing).

Transmitter (TX) processing circuitry 315 receives analog or digital voice data from microphone 320 or other outgoing baseband data (e.g., web data, e-mail, interactive video game data) from main processor 340. Transmitter (TX) processing circuitry 315 encodes, multiplexes, and/or digitizes the outgoing baseband data to produce a processed baseband or IF signal. Radio frequency (RF) transceiver 310 receives the outgoing processed baseband or IF signal from transmitter (TX) processing circuitry 315. Radio frequency (RF) transceiver 310 up-converts the baseband or IF signal to a radio frequency (RF) signal that is transmitted via antenna 305.

In an advantageous embodiment of the present invention, main processor 340 is a microprocessor or microcontroller. Memory 360 is coupled to main processor 340. According to an advantageous embodiment of the present invention, part of memory 360 comprises a random access memory (RAM) and another part of memory 360 comprises a Flash memory, which acts as a read-only memory (ROM).

Main processor 340 executes basic operating system (OS) program 361 stored in memory 360 in order to control the overall operation of wireless mobile station 111. In one such operation, main processor 340 controls the reception of forward channel signals and the transmission of reverse channel signals by radio frequency (RF) transceiver 310, receiver (RX) processing circuitry 325, and transmitter (TX) processing circuitry 315, in accordance with well-known principles.

Main processor 340 is capable of executing other processes and programs resident in memory 360. Main processor 340 can move data into or out of memory 360, as required by an executing process. Main processor 340 is also coupled to I/O interface 345. I/O interface 345 provides mobile station 111 with the ability to connect to other devices such as laptop computers and handheld computers. I/O interface 345 is the communication path between these accessories and main controller 340.

Main processor 340 is also coupled to keypad 350 and display unit 355. The operator of mobile station 111 uses keypad 350 to enter data into mobile station 111. Display 355 may be a liquid crystal display capable of rendering text and/or at least limited graphics from web sites. Alternate embodiments may use other types of displays.

Figure 4:
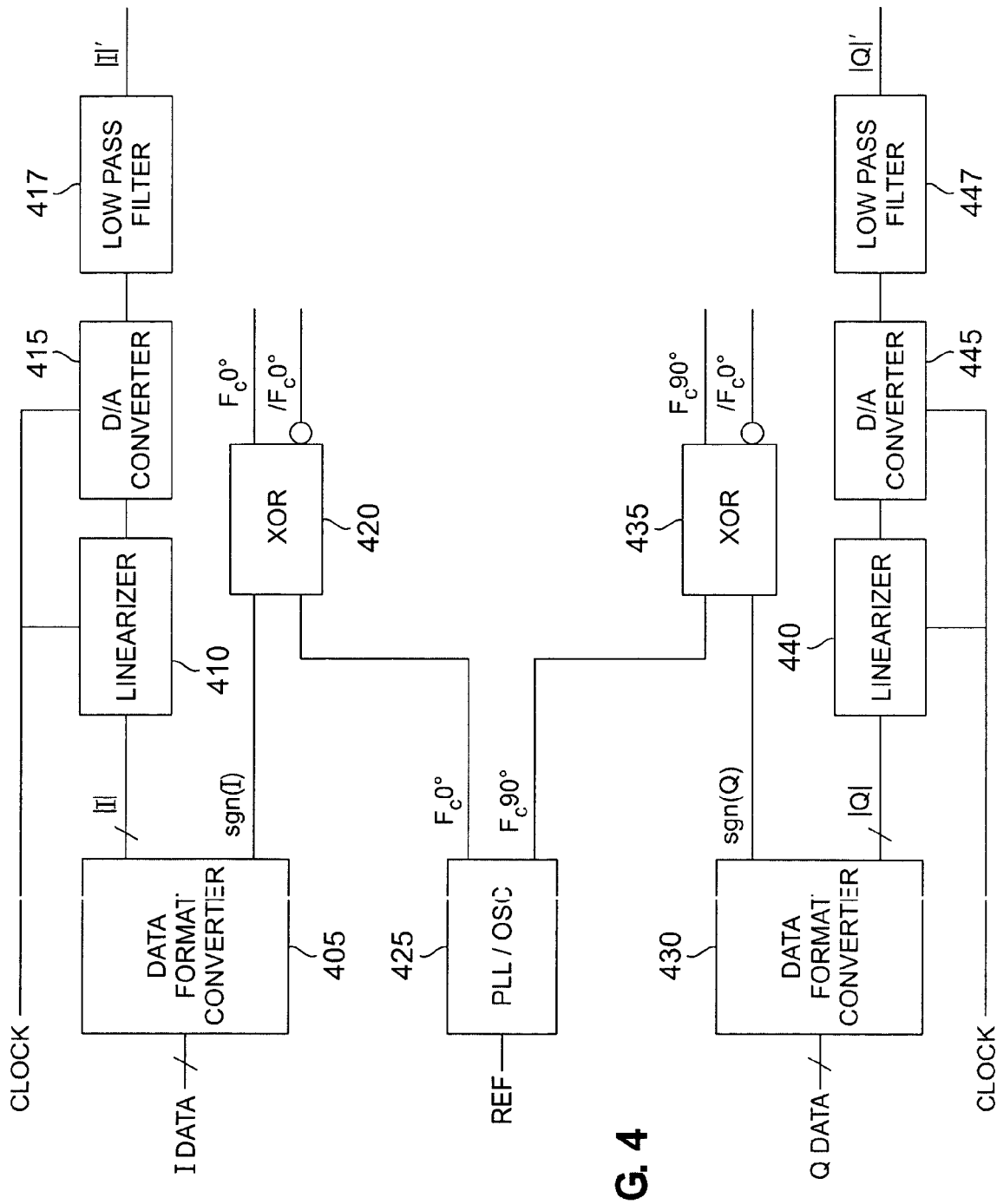
FIG. 4 illustrates a quadrature data converter block according to the principles of the present invention.

FIG. 4 illustrates a quadrature data converter block according to the principles of the present invention. In the direct quadrature modulation method disclosed herein, the switch-mode PA consists of two transistor structures—one for the I channel amplification and one for the Q channel. The two paths are combined into the load circuit to form the complete vector. In this method, the interpolated digital I and Q baseband information is conditioned in data format converters 405/430 to create the |I| and |Q| signals which represent the absolute value of the bipolar I and Q signals. The sign information of the I and Q data is separated into the sgn(I) and sgn(Q) signals. These signals are essentially the sign bits of the baseband I and Q data.

Similar to the polar modulation approach, an oscillator 425 generates the basic carrier frequency, $f_c$. This is generated in digital form in both the 0° component and a 90° delayed version. The complementary terms of the 0° component are generated from an exclusive-OR (XOR) function 420 that is also driven by the sgn(I) bit. This bit causes an inversion in the XOR function 420 whenever the baseband I data is a negative value. Likewise, the complementary terms of the 90° component are generated from an This causes an inversion in the XOR function 435 whenever the baseband Q data is a negative value.

In this manner the negative I and Q values can be modulated from a unipolar PA circuit. The complementary $f_c(0°)$ signals drive a totem-pole transistor structure to form the I switch. The complementary $f_c(90°)$ signals drive a totem-pole transistor structure to form the Q switch. Therefore, there is no actual phase information that must be modulated onto the carrier. The phases of the I and Q waveforms are constant with the exception of switching between the 0° and 180° states when the original I and Q waveform transition from positive to negative values.

|I| is passed through linearizer 410 and to DAC 415, to produce |I|'. |I|' is passed to low pass filter 417. Similarly, |Q| is passed through linearizer 440 and to DAC 445, to produce |Q|'. |Q|' is passed to low pass filter 447.

Figure 5:
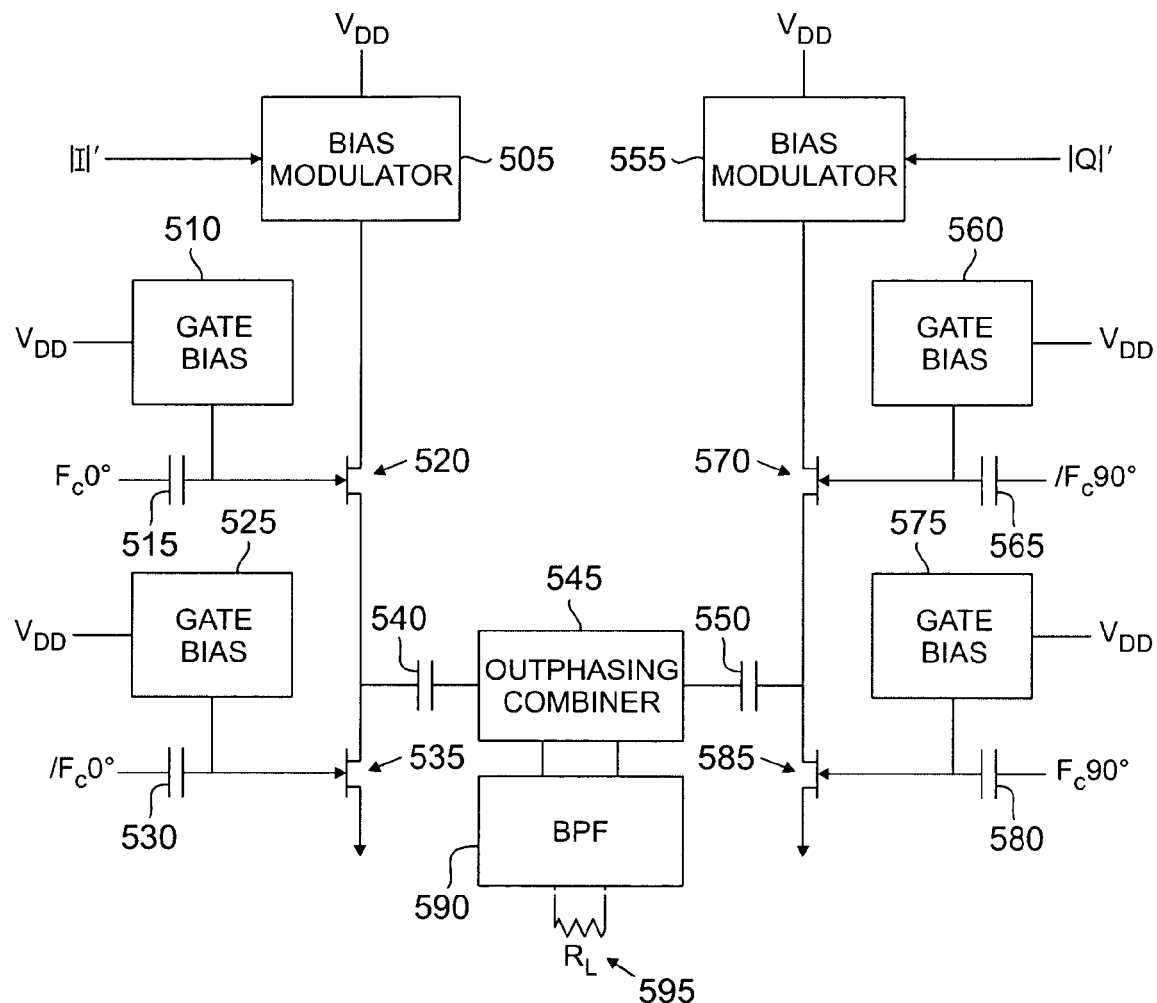
FIG. 5 illustrates a quadrature drive of an H-bridge power amplifier according to an exemplary embodiment of the present invention.

FIG. 5 illustrates a quadrature drive of an H-bridge power amplifier according to an exemplary embodiment of the present invention. The |I|' and |Q|' signals drive an amplitude/bias modulator block 505/555. This block is in essence a DC-to-DC converter that accepts a constant bias voltage and generates DC current at a secondary voltage that is proportional to the |I|' and |Q|' control signals.

The variable output voltages of the amplitude modulator blocks supply the drain bias of the power amplifiers stages (510/515/520/525/530/535/540 and 560/565/570/575/580/585/550, respectively). This results in a unipolar amplitude modulation of both the I and Q branches. Finally the phase and amplitude components of the modulation vector are then combined at the bandpass filter 590 to form the complete vector across RL 595.

Obviously, a perfectly linear amplitude and phase response will not be obtain from the direct drain modulation of the final transistor stages. Consequently, a linearization function is used to pre-distort the I and Q waveforms to compensate for the non-linear transistor response so that a linear amplitude modulation is obtained. The I and Q waveforms are pre-distorted so that after combination the composite vector has high modulation accuracy and low adjacent channel interference.

Due to the switch mode operation, high harmonic levels will be generated by the PA stage. The post-amplifier bandpass filter (BPF) attenuates the high harmonic levels resulting from the switching transients. In this manner, the switch-mode PA is able to deliver highly efficient operation using a quadrature modulation approach that is robust in its delay differences.

One advantage of the quadrature modulation technique is that since the I and Q conditioning circuits can be implemented identically on a common semiconductor, the delay differences would be negligible. The main timing constraint in the direct quadrature technique is that the sgn(I) be held synchronous with the |I| signal and likewise the sgn(Q) be held synchronous with the |Q| signal. This would be a simple matter since these functions would be implemented digitally on a common silicon substrate. This avoids the phase and magnitude problems commonly encountered in polar modulation techniques which tend to limit the practical bandwidth of that technique.

Another advantage is that, since the interface to most wireless modems is typically a digital quadrature interface, there is no quadrature-to-polar converter block that must be implemented in this architecture. The quadrature modulator generates the magnitude and sign components of the I and Q terms based solely on I and Q amplitude without having to calculate phase. This is an advantage over the polar modulation and LINC techniques which both rely on phase modulation of the carrier.

The direct quadrature modulation technique has advantages over the delta-sigma modulation approach in that there are no issues with loop stability. The fundamental clock used to derive the carrier frequency term is also easier to generate with the direct quadrature modulation technique, since it is generated at the fundamental carrier frequency rather than at two or four times the frequency. For carriers within the 800 to 2200 MHz range, this makes the direct quadrature modulation technique much more feasible for implementation in high-speed digital logic. Current semiconductor processes such as CMOS will support these speeds, whereas clock rates at 8 GHz will require more expensive device technologies such as SiGe BiCMOS.

The direct quadrature modulation technique also has advantages over the delta-sigma modulation approach in that it does not contain the severe bandwidth limitations caused by the noise transfer function of high-order delta sigma loops. Also, the bandpass filter used in the direct quadrature modulation technique can be a wideband filter covering the entire operating band of interest, whereas the delta-sigma modulator approach typically must utilize a narrow band filter that is constrained by the width of the delta-sigma modulator noise transfer function. This bandwidth will typically be on the order of 20 MHz or less, which is about a 1 to 2% bandwidth. This is a severe limitation for wireless operators that own different frequency blocks in various markets that want to avoid stocking multiple versions of the same power amplifier. This would not be an issue for a power amplifier using the direct quadrature modulation technique.

Although the present invention has been described with an exemplary embodiment, various changes and modifications may be suggested to one skilled in the art. It is intended that the present invention encompass such changes and modifications as fall within the scope of the appended claims.

What is claimed is:
1. An RF transmitter comprising:
   a quadrature source data block capable of receiving an input in-phase (I) data stream and an input quadrature (Q) data stream and generating therefrom an in-phase absolute value (|I|') data signal; and a quadrature absolute value (|Q|') data signal; and
   a quadrature modulation block comprising
      a first totem pole transistor structure containing a first bias modulator controlled by said |I|' data signal and
      a second totem pole transistor structure containing a second bias modulator controlled by said |Q|' data signal,
   wherein the quadrature source data block also generates sign signals sgn(I) and sgn(Q) indicating the signs of the I data stream and Q data stream respectively and
   wherein sgn(I) and a digital carrier frequency are input to a first XOR operation to produce complementary terms to bi-phase modulate the in-phase (I) carrier component and
   wherein sgn(Q) and the digital carrier frequency are input to a second XOR operation to produce complementary terms to bi-phase modulate the quadrature (Q) carrier component separately.

2. The RF transmitter of claim 1, wherein sgn(I) is kept synchronized with |I| and sgn(Q) is kept synchronized with |Q|.

3. The RF transmitter of claim 1, wherein said quadrature modulation block amplitude modulates the separate bi-phase modulated quadrature components of the carrier.

4. The RF transmitter of claim 3, wherein said amplitude modulated bi-phase modulated quadrature components of the carrier are first power amplified and then combined.

5. The RF transmitter of claim 4, wherein a switch mode, totem pole or H-bridge amplifier structure is used to separately power amplify the modulated in-phase and quadrature carrier components and an out-phasing combiner is used to combine the amplified carrier components into a single modulated carrier.

6. A base station for use in a wireless network, comprising:
a processor and an accessible memory;
a transceiver connected to be controlled by the processor, the transceiver including
 a quadrature source data block capable of receiving an input in-phase (I) data stream and an input quadrature (Q) data stream and generating therefrom an in-phase absolute value (|I|') data signal and a quadrature absolute value (|Q|') data signal, and
 a quadrature modulation block comprising
  a first totem pole transistor structure containing a first bias modulator controlled by said |I|' data signal and
  a second totem pole transistor structure containing a second bias modulator controlled by said |Q|' data signal,
 wherein the quadrature source data block also generates sign signals sgn(I) and sgn(Q) indicating the signs of the I data stream and Q data stream respectively, and
 wherein sgn(I) and a digital carrier frequency are input to a first XOR operation to produce complementary terms to bi-phase modulate the in-phase (I) carrier component and
 wherein sgn(Q) and the digital carrier frequency are input to a second XOR operation to produce complementary terms to bi-phase modulate the quadrature (Q) carrier component separately.

7. The base station of claim 6, wherein sgn(I) is kept synchronized with |I| and sgn(Q) is kept synchronized with |Q|.

8. The base station of claim 6, wherein said quadrature modulation block amplitude modulates the separate bi-phase modulated quadrature components of the carrier.

9. The base station of claim 8, wherein said amplitude modulated bi-phase modulated quadrature components of the carrier are first power amplified and then combined.

10. The base station of claim 9, wherein a switch mode, totem pole or H-bridge amplifier structure is used to separately power amplify the modulated in-phase and quadrature carrier components and an out-phasing combiner is used to combine the amplified carrier components into a single modulated carrier.

11. A mobile station for use in a wireless network, comprising:
a processor and an accessible memory;
a transceiver connected to be controlled by the processor, the transceiver including
 a quadrature source data block capable of receiving an input in-phase (I) data stream and an input quadrature (Q) data stream and generating therefrom an in-phase absolute value (|I|') data signal and a quadrature absolute value (|Q|') data signal, and
 a quadrature modulation block comprising
  a first totem pole transistor structure containing a first bias modulator controlled by said |I|' data signal and
  a second totem pole transistor structure containing a second bias modulator controlled by said |Q|' data signal
 wherein the quadrature source data block also generates sign signals sgn(I) and sgn(Q) indicating the signs of the I data stream and Q data stream respectively, and
 wherein sgn(I) and a digital carrier frequency are input to a first XOR operation to produce complementary terms to bi-phase modulate the in-phase (I) carrier component and
 wherein sgn(Q) and the digital carrier frequency are input to a second XOR operation to produce complementary terms to bi-phase modulate the quadrature (Q) carrier component separately.

12. The mobile station of claim 11, wherein sgn(I) is kept synchronized with |I| and sgn(Q) is kept synchronized with |Q|.

13. The mobile station of claim 12, wherein said quadrature modulation block amplitude modulates the separate bi-phase modulated quadrature components of the carrier.

14. The mobile station of claim 13, wherein said amplitude modulated bi-phase modulated quadrature components of the carrier are first power amplified and then combined.

15. The mobile station of claim 14, wherein a switch mode, totem pole or H-bridge amplifier structure is used to separately power amplify the modulated in-phase and quadrature carrier components and an out-phasing combiner is used to combine the amplified carrier components into a single modulated carrier.

16. The RF transmitter of claim 1, wherein a switch mode, totem pole or H-bridge amplifier structure is used to separately power amplify the modulated in-phase and quadrature carrier components.

17. The RF transmitter of claim 16, wherein an out-phasing combiner is used to combine the amplified carrier components into a single modulated carrier.

18. The RF transmitter of claim 6, wherein a switch mode, totem pole or H-bridge amplifier structure is used to separately power amplify the modulated in-phase and quadrature carrier components.

19. The RF transmitter of claim 18, wherein an out-phasing combiner is used to combine the amplified carrier components into a single modulated carrier.

20. The RF transmitter of claim 11, wherein a switch mode, totem pole or H-bridge amplifier structure is used to separately power amplify the modulated in-phase and quadrature carrier components and an out-phasing combiner is used to combine the amplified carrier components into a single modulated carrier.

* * * * *

UNITED STATES PATENT AND TRADEMARK OFFICE
CERTIFICATE OF CORRECTION

PATENT NO. : 7,773,693 B2  Page 1 of 1
APPLICATION NO. : 11/168227
DATED : August 10, 2010
INVENTOR(S) : Michael L. Brobston It is certified that error appears in the above-identified patent and that said Letters Patent is hereby corrected as shown below:

Column 7, line 6, insert --exclusive OR function 435 that is also driven by the sgn(Q) bit.-- after the term "an".

Signed and Sealed this
Eighth Day of March, 2011

David J. Kappos
*Director of the United States Patent and Trademark Office*